(12) United States Patent
Komatsu et al.

(10) Patent No.: US 12,412,794 B2
(45) Date of Patent: Sep. 9, 2025

(54) MODULE HAVING A CHANGING FILLER CONTENT RATE IN SEALING RESIN LAYER

(71) Applicant: Murata Manufacturing Co., Ltd., Nagaokakyo (JP)

(72) Inventors: Toru Komatsu, Nagaokakyo (JP); Tadashi Nomura, Nagaokakyo (JP)

(73) Assignee: MURATA MANUFACTURING CO., LTD., Kyoto-fu (JP)

( * ) Notice: Subject to any disclaimer, the term of this patent is extended or adjusted under 35 U.S.C. 154(b) by 492 days.

(21) Appl. No.: 17/655,180

(22) Filed: Mar. 17, 2022

(65) Prior Publication Data

US 2022/0208626 A1   Jun. 30, 2022

Related U.S. Application Data

(63) Continuation of application No. PCT/JP2020/031103, filed on Aug. 18, 2020.

(30) Foreign Application Priority Data

Sep. 20, 2019   (JP) .................................. 2019-171766
Jul. 17, 2020   (JP) .................................. 2020-122590

(51) Int. Cl.
*H01L 23/29*   (2006.01)
*H01L 21/56*   (2006.01)
(Continued)

(52) U.S. Cl.
CPC .......... *H01L 23/295* (2013.01); *H01L 21/561* (2013.01); *H01L 23/3135* (2013.01);
(Continued)

(58) Field of Classification Search
CPC ... H01L 21/56; H01L 23/3121; H01L 23/552; H01L 2924/3025; H01L 23/544; H01L 2223/5442; H01L 2223/54433; H05K 9/00
See application file for complete search history.

(56) References Cited

U.S. PATENT DOCUMENTS

2002/0177294 A1   11/2002   Otaki
2014/0284775 A1*  9/2014   Nomura ................. H01L 24/85
                                                       257/659
(Continued)

FOREIGN PATENT DOCUMENTS

JP   H01-120091 A   5/1989
JP   2000-022052 A  1/2000
(Continued)

OTHER PUBLICATIONS

International Search Report for International Patent Application No. PCT/JP2020/031103 dated Nov. 17, 2020.
Written Opinion for International Patent Application No. PCT/JP2020/031103 dated Nov. 17, 2020.

*Primary Examiner* — Michael Jung
*Assistant Examiner* — Mikka Liu
(74) *Attorney, Agent, or Firm* — McDonald Hopkins LLC

(57) ABSTRACT

A module includes a substrate, a first component, and a first sealing resin layer. The substrate includes a first principal surface. The first component is mounted on the first principal surface. The first sealing resin layer contains a filler containing an inorganic oxide as a main component. The first sealing resin layer is provided on the first principal surface. The first sealing resin layer seals the first component. A marking portion is provided on a surface of the first sealing resin layer on a side opposite to the substrate. In the first sealing resin layer, the content rate of the filler is smaller in (Continued)

a second portion on the side opposite to the substrate than in a first portion on the substrate.

18 Claims, 12 Drawing Sheets

(51) Int. Cl.
    *H01L 23/31*     (2006.01)
    *H01L 23/552*     (2006.01)
    *H01L 25/16*     (2023.01)
    *H01L 23/544*     (2006.01)

(52) U.S. Cl.
    CPC ............ *H01L 23/552* (2013.01); *H01L 25/16* (2013.01); *H01L 23/3128* (2013.01); *H01L 23/544* (2013.01); *H01L 2223/5442* (2013.01)

(56) References Cited

U.S. PATENT DOCUMENTS

| | | | |
|---|---|---|---|
| 2018/0077802 A1* | 3/2018 | Kidoguchi | H05K 1/0298 |
| 2019/0074431 A1* | 3/2019 | Hasegawa | H01L 21/568 |
| 2020/0375022 A1 | 11/2020 | Nomura | |

FOREIGN PATENT DOCUMENTS

| | | |
|---|---|---|
| JP | 2001-044304 A | 2/2001 |
| JP | 2002-353347 A | 12/2002 |
| JP | 2015-015498 A | 1/2015 |
| JP | 2018-019067 A | 2/2018 |
| WO | 2018/116728 A1 | 6/2018 |
| WO | 2019/159913 A1 | 8/2019 |

* cited by examiner

MODULE HAVING A CHANGING FILLER CONTENT RATE IN SEALING RESIN LAYER

CROSS REFERENCE TO RELATED APPLICATION

This is a continuation of International Application No. PCT/JP2020/031103 filed on Aug. 18, 2020 which claims priority from Japanese Patent Application No. 2019-171766 filed on Sep. 20, 2019 and Japanese Patent Application No. 2020-122590 filed on Jul. 17, 2020. The contents of these applications are incorporated herein by reference in their entireties.

BACKGROUND OF THE DISCLOSURE

Field of the Disclosure

The present disclosure relates to a module.

Description of the Related Art

Japanese Patent Laying-Open No. 2015-15498 (PTL 1) discloses a configuration of a module. The module disclosed in PTL 1 includes a wiring substrate, a semiconductor element, a molding resin, and a shield layer. The semiconductor element is mounted on the wiring substrate. The mold resin seals the semiconductor element. The shield layer is provided on the mold resin. The molding resin has a marking on a surface by laser irradiation. The shield layer is provided on the molding resin having the marking.

PTL 1: Japanese Patent Laying-Open No. 2015-15498

BRIEF SUMMARY OF THE DISCLOSURE

In the conventional module, sometimes a filler made of an inorganic oxide is added to a sealing resin layer. However, when the filler is added to the sealing resin layer while a thickness of the sealing resin layer is reduced in order to reduce a height of the module, sometimes the marking laser applied to the sealing resin layer passes through the sealing resin layer through the filler. When the transmitted laser reaches a component mounted on the substrate sealed by the sealing resin layer, the laser may damage the component.

The present disclosure has been made in view of the above problems, and an object of the present disclosure is to provide a module capable of reducing the height while preventing the damage to the component mounted on the substrate by the irradiation with the marking laser.

A module according to the present disclosure includes a substrate, a first component, and a first sealing resin layer. The substrate includes a first principal surface. The first component is mounted on the first principal surface. The first sealing resin layer contains a filler containing an inorganic oxide as a main component. The first sealing resin layer is provided on the first principal surface. The first sealing resin layer seals the first component. A marking portion is provided on a surface of the first sealing resin layer on a side opposite to the substrate. In the first sealing resin layer, a content rate of the filler is smaller in a second portion on the side opposite to the substrate than in a first portion on the substrate.

According to the present disclosure, the height of the module can be reduced while the damage to the component mounted on the substrate by the irradiation with the marking laser is prevented.

DETAILED DESCRIPTION OF THE DISCLOSURE

Figure 1:
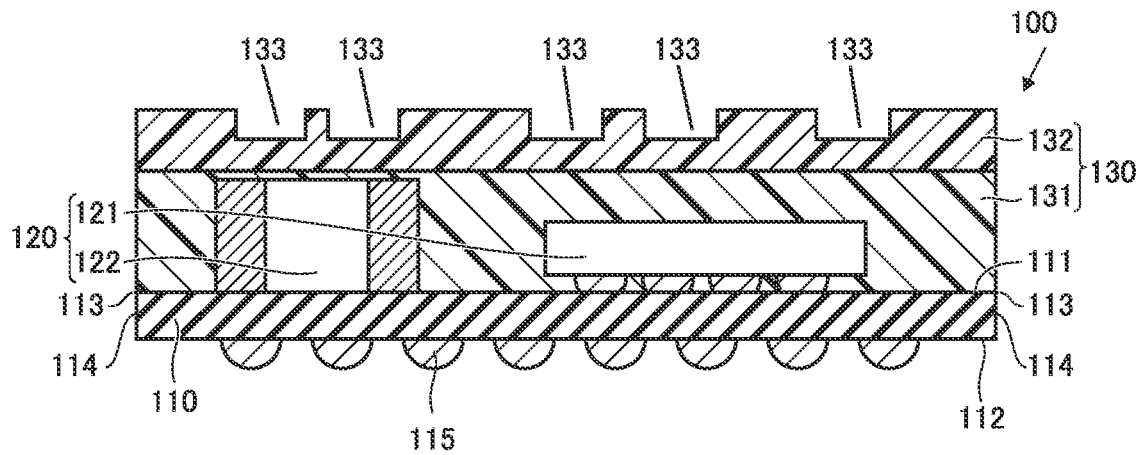
FIG. 1 is a sectional view illustrating a module according to a first embodiment of the present disclosure.

With reference to the drawings, a module according to each embodiment of the present disclosure will be described below. In the following description of each embodiment, the same or corresponding portion in the drawings is denoted the same reference numeral, and the description will not be repeated. In the present specification, the "color" of the material refers to a color exhibited in a visible light region.

First Embodiment

FIG. 1 is a sectional view illustrating a module according to a first embodiment of the present disclosure. As illustrated in FIG. 1, a module 100 of the first embodiment of the present disclosure includes a substrate 110, a first component 120, and a first sealing resin layer 130.

Substrate 110 includes a first principal surface 111 and a second principal surface 112. Second principal surface 112 is located on the side opposite to first principal surface 111. Substrate 110 has a peripheral side surface 114 extending from a peripheral end 113 of first principal surface 111 toward second principal surface 112. Peripheral side surface 114 connects first principal surface 111 and second principal surface 112.

In the first embodiment, a plurality of external terminals 115 are provided on the second principal surface. For example, external terminal 115 is a solder bump.

First component 120 is mounted on first principal surface 111. In the first embodiment, a plurality of first components 120 are mounted as first components 120. Among the plurality of first components 120, for example, a first component 121 is an integrated circuit (IC), and a first component 122 is an inductor or a capacitor.

First sealing resin layer 130 is provided on first principal surface 111. First sealing resin layer 130 seals first component 120. Other components may be provided on first principal surface 111. The other components may be sealed by first sealing resin layer 130 or exposed from first sealing resin layer 130.

First sealing resin layer 130 includes a filler containing an inorganic oxide as a main component. In the first embodiment, the filler is granular, specifically, spherical. For example, $SiO_2$ or $Al_2O_3$ can be cited as the inorganic oxide. The "filler containing the inorganic oxide as a main component" refers to a state in which the inorganic oxide occupies half or more of the filler by weight. In the first embodiment, the filler is made of the inorganic oxide, and the inorganic oxide is $SiO_2$, more specifically silica glass.

First sealing resin layer 130 has improved adhesion and increased strength by including the filler. The filler is preferably included in first sealing resin layer 130 such that at least the first portion of first sealing resin layer 130 on the side of substrate 110 approaches a linear expansion coefficient substantially equal to that of first component 120. The filler made of $SiO_2$ in the first embodiment transmits the laser beam.

In first sealing resin layer 130, a maximum diameter of the filler is smaller in the second portion on the side opposite to substrate 110 than in the first portion on the side of substrate 110. In first sealing resin layer 130, the maximum diameter of the filler included in the first portion on the side of substrate 110 is preferably greater than or equal to 20 μm and less than or equal to 30 μm. Thus, first sealing resin layer 130 can be configured to have a thermal expansion coefficient substantially equal to that of first component 120. In first sealing resin layer 130, the maximum diameter of the filler included in the second portion on the side opposite to substrate 110 is preferably less than or equal to 7 μm. As the filler is smaller, the transmission of the laser in first sealing resin layer 130 is prevented at the time of forming a later-described marking portion by irradiating first sealing resin layer 130 with the laser, and the influence of the laser on first component 120 is reduced. Accordingly, the thickness of first sealing resin layer 130 is not required to increase in order to prevent the laser transmission in first sealing resin layer 130, and as a result, first sealing resin layer 130 can be thinned. In the first embodiment, the second portion occupies the entire portion of first sealing resin layer 130 on the side opposite to substrate 110.

In first sealing resin layer 130, a content rate of the filler is smaller in the second portion on the side opposite to substrate 110 than in the first portion on the side of substrate 110. In first sealing resin layer 130, the content rate of the filler contained in the first portion on the side of substrate 110 is preferably greater than or equal to 70 mass % and less than or equal to 90 mass %. Thus, first sealing resin layer 130 can be configured to have a thermal expansion coefficient substantially equal to that of first component 120. In first sealing resin layer 130, the content rate of the filler contained in the second portion on the side opposite to substrate 110 is preferably as small as possible, and most preferably zero. As the content rate of the filler decreases, the laser transmission in first sealing resin layer 130 is prevented at the time of forming the later-described marking portion by irradiating first sealing resin layer 130 with the laser, and the influence of the laser on first component 120 is reduced. Accordingly, the thickness of first sealing resin layer 130 is not required to increase in order to prevent the laser transmission in first sealing resin layer 130, and as a result, first sealing resin layer 130 can be thinned.

In the first embodiment, the content rate of the filler and the maximum diameter in first sealing resin layer 130 can be measured by observing a cut surface obtained by cutting first sealing resin layer 130 included in module 100 using a scanning electron microscope (SEM) or the like. For example, the content rate can be calculated from the sum of the sectional areas of the fillers occupying the entire cut surface of first sealing resin layer 130, the density of first sealing resin layer 130, and the density of the fillers. The content rate of the filler in first sealing resin layer 130 may be calculated by collecting a test piece from first sealing resin layer 130 and measuring the weight of the test piece and the weight of the filler in the test piece obtained by burning the test piece to evaporate the resin component.

In the first embodiment, first sealing resin layer 130 is laminated on substrate 110 and includes a plurality of resin layers having different content rates of fillers made of inorganic oxides from each other. In the first embodiment, the plurality of resin layers include a base layer 131 and a marking layer 132. The plurality of resin layers may include a layer other than base layer 131 and the marking layer, but in the first embodiment, the plurality of resin layers are made of base layer 131 and marking layer 132. First sealing resin layer 130 may be one layer containing a single resin material.

In the first embodiment, base layer 131 is disposed on first principal surface 111 of substrate 110, and marking layer 132 is disposed on base layer 131. That is, in the first embodiment, the first portion of first sealing resin layer 130 on the side of substrate 110 corresponds to base layer 131, and the second portion of first sealing resin layer 130 on the side opposite to substrate 110 corresponds to marking layer 132.

In the first embodiment, base layer 131 seals first component 120, and first component 120 may be exposed from base layer 131. When first component 120 is exposed from base layer 131, the layer other than base layer 131 among the plurality of resin layers only has to seal first component 120. For example, marking layer 132 may seal first component 120.

Marking layer 132 may be made of a filler-less resin containing no filler made of the inorganic oxide. The thickness of the thinnest portion of marking layer 132 is not particularly limited, but when marking layer 132 does not contain the filler, the thickness of the thinnest portion of marking layer 132 is preferably greater than or equal to 5 μm and less than or equal to 10 μm. When marking layer 132 includes the filler made of the inorganic oxide, the thickness dimension of the thinnest portion of marking layer 132 is preferably larger than the maximum diameter dimension of the filler made of the inorganic oxide.

First sealing resin layer 130 may contain a conductive filler in addition to the filler made of the inorganic oxide. For example, carbon black can be cited as the conductive filler.

In the first embodiment, among the plurality of resin layers constituting first sealing resin layer 130, at least one layer located on the side opposite to substrate 110 of first component 120 is colored and thus has a light shading property. In the first embodiment, the at least one layer is black, and may have other colors. Among the plurality of resin layers, layers other than the at least one layer may also be colored. In the first embodiment, because both base layer 131 and marking layer 132 are colored, they have the light shading property. In the first embodiment, both base layer 131 and marking layer 132 are black.

As described above, in the first embodiment, first sealing resin layer 130 is colored. However, first sealing resin layer 130 may be colored by the colored resin material constituting first sealing resin layer 130, or colored by containing the conductive filler such as black carbon. When first sealing resin layer 130 is colored only by containing the conductive filler such as carbon black, the light shading property of first sealing resin layer 130 decreases as first sealing resin layer 130 becomes thinner. For this reason, in the first embodiment, the resin material contained in first sealing resin layer 130 is preferably colored. Thus, as compared with the case where first sealing resin layer 130 is colored only by containing the conductive filler, degradation of the light shading property can be prevented when first sealing resin layer 130 is thinned.

A marking portion 133 is provided on a surface of first sealing resin layer 130 on the side opposite to substrate 110. In the first embodiment, marking portion 133 is configured to be visually recognizable as a character, a figure, or a symbol when module 100 is viewed from the side of first sealing resin layer 130. Thus, module 100 can be distinguished from other modules. In the first embodiment, marking portion 133 is located so as to overlap at least one first component 120 when viewed from a laminating direction in which first sealing resin layer 130 is laminated on substrate 110.

Marking portion 133 has an outer shape of a recessed stripe. A depth of marking portion 133 is greater than or equal to 4 μm. When the depth of marking portion 133 is greater than or equal to 4 μm, marking portion 133 is easily visually recognized as the character, the figure, or the symbol.

A method for manufacturing module 100 of the first embodiment of the present disclosure will be described below.

Figure 2:
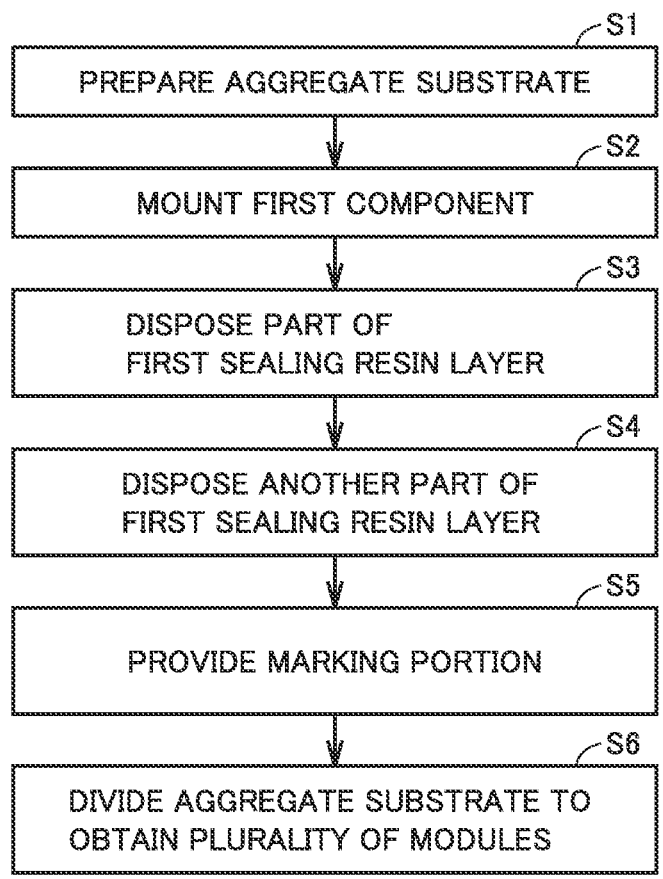
FIG. 2 is a flowchart illustrating a method for manufacturing the module of the first embodiment of the present disclosure.

FIG. 2 is a flowchart illustrating the method for manufacturing the module of the first embodiment of the present disclosure. As illustrated in FIG. 2, the method for manufacturing the module of the first embodiment of the present disclosure includes a step S1 of preparing the aggregate substrate, a step S2 of mounting the first component, a step S3 of disposing a part of the first sealing resin layer, a step S4 of disposing another part of first sealing resin layer, a step S5 of providing the marking portion, and a step S6 of dividing the aggregate substrate to obtain the plurality of modules.

Figure 3:
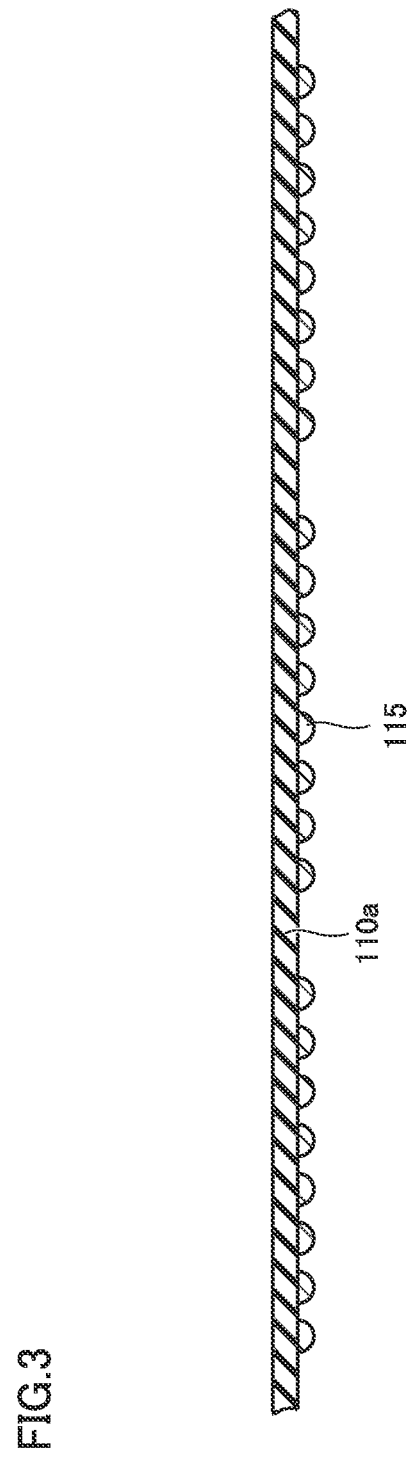
FIG. 3 is a sectional view illustrating a state in which an aggregate substrate is prepared in the method for manufacturing the module of the first embodiment of the present disclosure.

FIG. 3 is a sectional view illustrating a state in which the aggregate substrate is prepared in the method for manufacturing the module of the first embodiment of the present disclosure. As illustrated in FIGS. 1 and 3, in step S1 of preparing an aggregate substrate 110a, aggregate substrate 110a is an aggregate of substrates 110 included in each of the plurality of modules 100. Specifically, aggregate substrate 110a is in a state in which the plurality of substrates 110 are connected to each other on peripheral side surface 114. Although external terminal 115 is previously formed on prepared aggregate substrate 110a, external terminal 115 may be formed in any of steps S2 to S5 when external terminal 115 is a solder bump.

Figure 4:
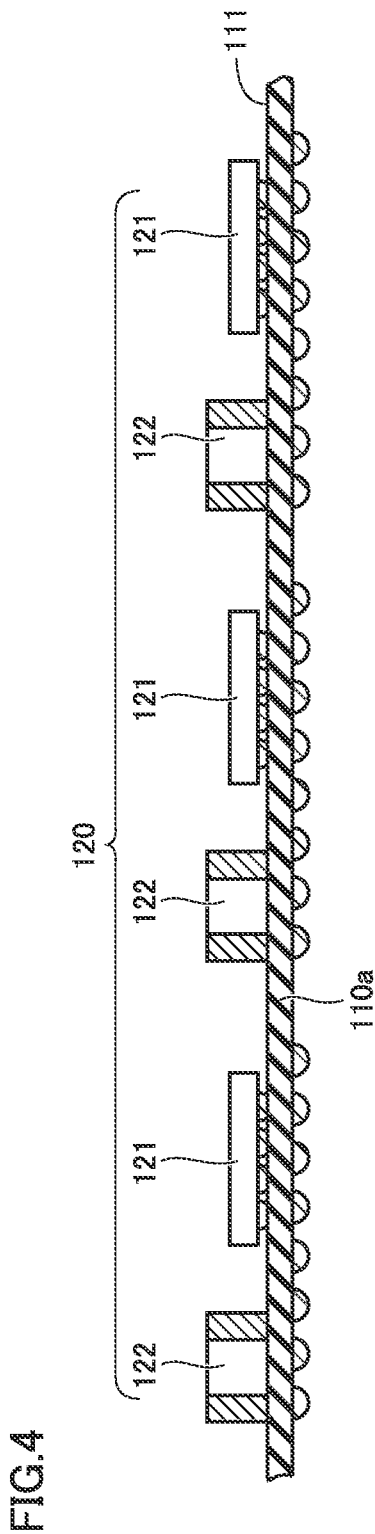
FIG. 4 is a sectional view illustrating a state in which a first component is mounted on the aggregate substrate in the method for manufacturing the module of the first embodiment of the present disclosure.

FIG. 4 is a sectional view illustrating a state in which the first component is mounted on the aggregate substrate in the method for manufacturing the module of the first embodiment of the present disclosure. As illustrated in FIG. 4, in step S2 of mounting first component 120, the plurality of first components 120 are mounted on first principal surface 111 of aggregate substrate 110a.

Figure 5:
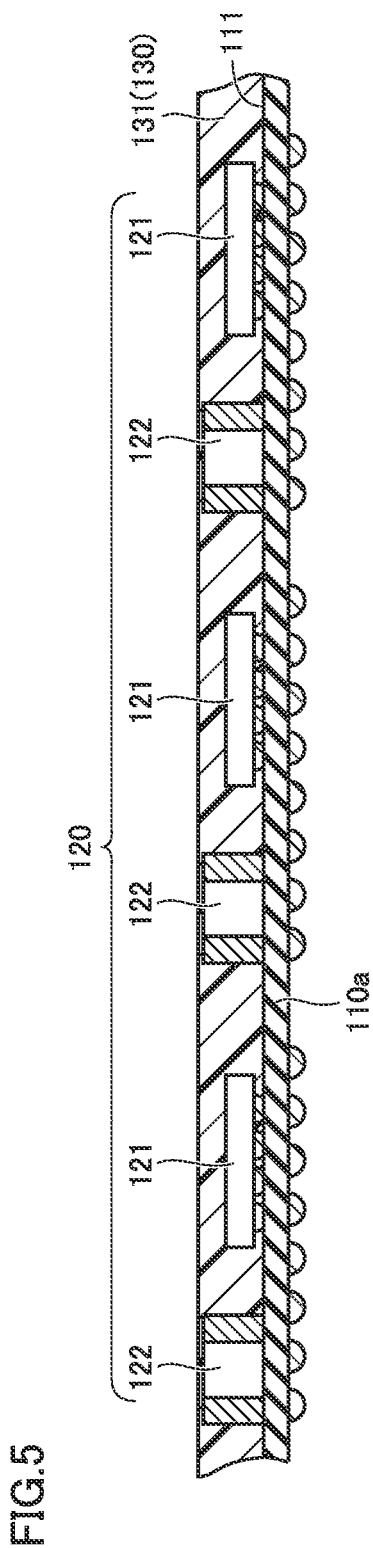
FIG. 5 is a sectional view illustrating a state in which a part of a first sealing resin layer is disposed on a first principal surface of the aggregate substrate in the method for manufacturing the module of the first embodiment of the present disclosure.

FIG. 5 is a sectional view illustrating a state in which a part of the first sealing resin layer is disposed on the first principal surface of the aggregate substrate in the method for manufacturing the module of the first embodiment of the present disclosure. As illustrated in FIG. 5, in step S3 of disposing a part of first sealing resin layer 130, base layer 131 is disposed as a part of first sealing resin layer 130 on first principal surface 111 of aggregate substrate 110a. In the first embodiment, base layer 131 is disposed by being ground from the side opposite to first principal surface 111 after being laminated on first principal surface 111. Thus, the thickness of base layer 131 can be reduced as much as possible while base layer 131 is configured to cover first component 120 at least on first principal surface 111.

Figure 6:
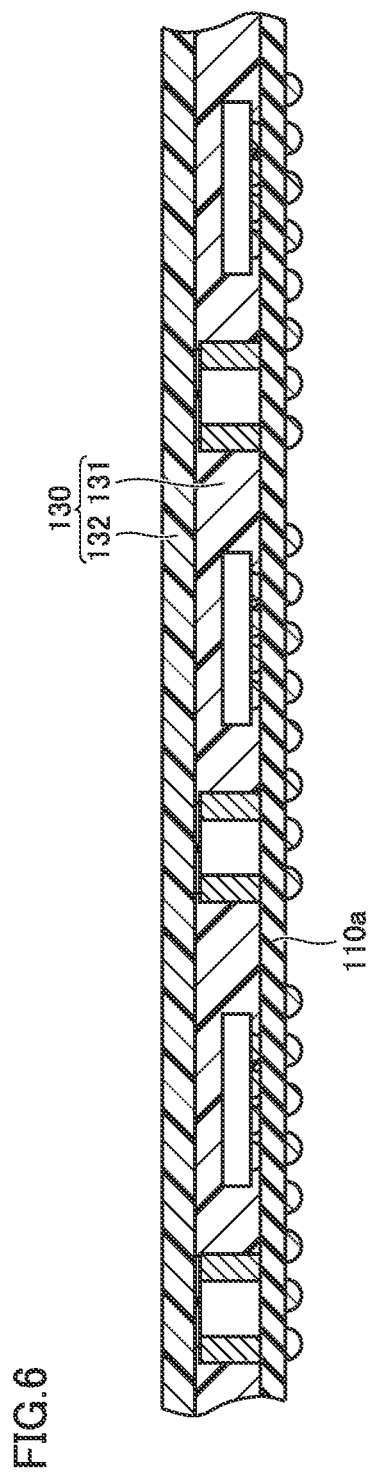
FIG. 6 is a sectional view illustrating a state in which another part of the first sealing resin layer is disposed on a part of the first sealing resin layer on a side opposite to the aggregate substrate in the method for manufacturing the module of the first embodiment of the present disclosure.

FIG. 6 is a sectional view illustrating a state in which another part of the first sealing resin layer is disposed on a part of the first sealing resin layer on the side opposite to the aggregate substrate in the method for manufacturing the module of the first embodiment of the present disclosure. As illustrated in FIG. 6, in step S4 of disposing another part of first sealing resin layer 130, marking layer 132 is disposed as another part of first sealing resin layer 130 on a base layer 131 that is a part of first sealing resin layer 130 on the side opposite to aggregate substrate 110a. In the first embodiment, marking layer 132 is disposed by applying the material constituting marking layer 132.

Figure 7:
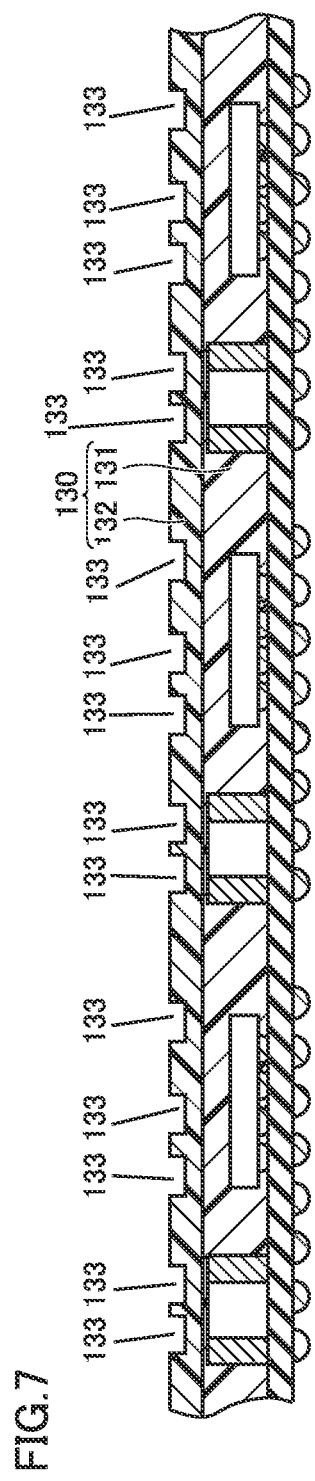
FIG. 7 is a sectional view illustrating a state in which a marking portion is provided by irradiating the first sealing resin layer with a laser beam in the method for manufacturing the module of the first embodiment of the present disclosure.

FIG. 7 is a sectional view illustrating a state in which the marking portion is provided by irradiating the first sealing resin layer with the laser beam in the method for manufacturing the module of the first embodiment of the present disclosure. As illustrated in FIG. 7, in step S5 of providing marking portion 133, in the first embodiment, only marking layer 132 is irradiated with the marking laser to form the plurality of marking portions 133.

In the irradiation with the marking laser, preferably a wavelength of the marking laser is appropriately changed in consideration of transmittance of first sealing resin layer 130. In the first embodiment, for example, the wavelength of the marking laser is less than or equal to 532 nm. When the wavelength of the marking laser is less than or equal to 532 nm, the transmittance of the marking laser in first sealing resin layer 130 can be made relatively low. Thus, it is possible to prevent the marking laser from passing through first sealing resin layer 130 and reaching first component 120 to damage first component 120. Consequently, the thickness of first sealing resin layer 130 can be reduced, whereby the height of module 100 can be reduced.

Figure 8:
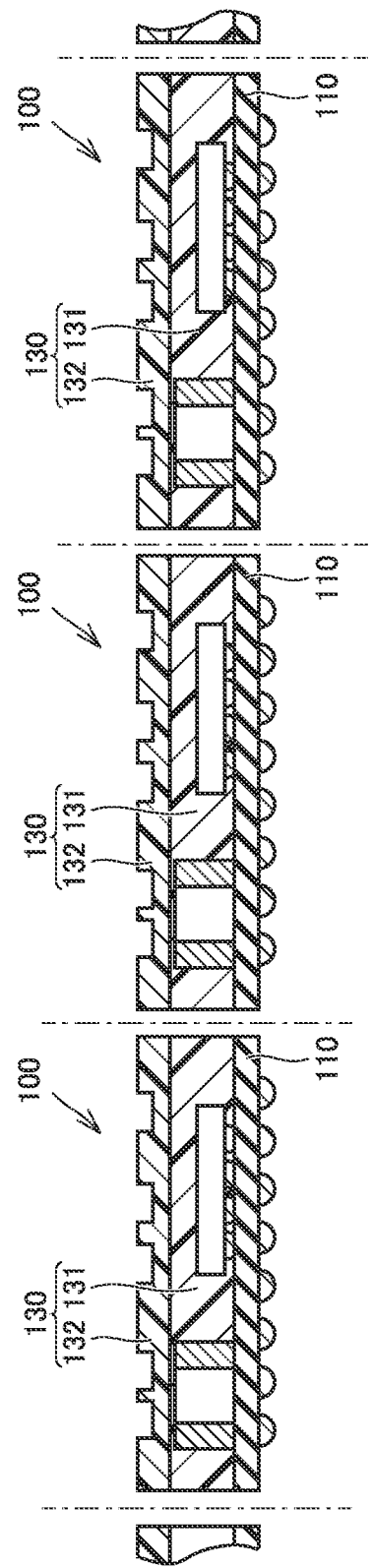
FIG. 8 is a sectional view illustrating a state in which the aggregate substrate is divided to obtain a plurality of modules in the method for manufacturing the module of the first embodiment of the present disclosure.

FIG. 8 is a sectional view illustrating a state in which the aggregate substrate is divided to obtain a plurality of modules in the method for manufacturing the module of the first embodiment of the present disclosure. As illustrated in FIG. 8, in step S6 of dividing aggregate substrate 110a to obtain the plurality of modules 100, aggregate substrate 110a is divided into pieces to obtain the plurality of modules 100. Along with the division of aggregate substrate 110a, in the first embodiment, first sealing resin layer 130 is also divided.

Through the above steps, module 100 of the first embodiment of the present disclosure as illustrated in FIG. 1 is manufactured.

As described above, in module 100 of the first embodiment of the present disclosure, first sealing resin layer 130 contains the filler containing the inorganic oxide as the main component. First sealing resin layer 130 seals first component 120. A marking portion 133 is provided on a surface of first sealing resin layer 130 on the side opposite to substrate 110. In first sealing resin layer 130, the content rate of the filler is smaller in the second portion on the side opposite to substrate 110 than in the first portion on the side of substrate 110.

Thus, the height of module 100 can be reduced by reducing the thickness of first sealing resin layer 130 while the damage to first component 120 mounted on first principal surface 111 of substrate 110 by the irradiation with the marking laser is prevented.

In the first embodiment, the filler made of the inorganic oxide is granular. In first sealing resin layer 130, the maximum diameter of the filler made of the inorganic oxide is smaller in the second portion on the side opposite to substrate 110 than in the first portion on the side of substrate 110.

Thus, the damage to first component 120 mounted on the first principal surface of substrate 110 by the irradiation with the marking laser can be suppressed, and the thickness of the second portion of first sealing resin layer 130 on the side opposite to substrate 110 can be further reduced.

In the first embodiment, first sealing resin layer 130 is laminated on substrate 110 and includes a plurality of resin layers having different filler content rates from each other. Thus, a portion having a high content rate of the filler made of the inorganic oxide and a portion having a low content rate of the filler in first sealing resin layer 130 can be easily provided.

In the first embodiment, among the plurality of resin layers, at least one layer located on the side opposite to substrate 110 of first component 120 has the light shading property. Thus, first component 120 can be prevented from being visually recognized through first sealing resin layer 130 and the visibility of the letter, the figure, or the symbol formed by marking portion 133 can be improved. At the same time, in first sealing resin layer 130, the layer located on the side opposite to substrate 110 of first component 120 can be thinned.

Second Embodiment

A module according to a second embodiment of the present disclosure will be described below. The module of the second embodiment of the present disclosure is mainly different from module 100 of the first embodiment of the present disclosure in that the component is mounted on second principal surface 112. Accordingly, the description of the same configuration as that of module 100 of the first embodiment of the present disclosure will not be repeated.

Figure 9:
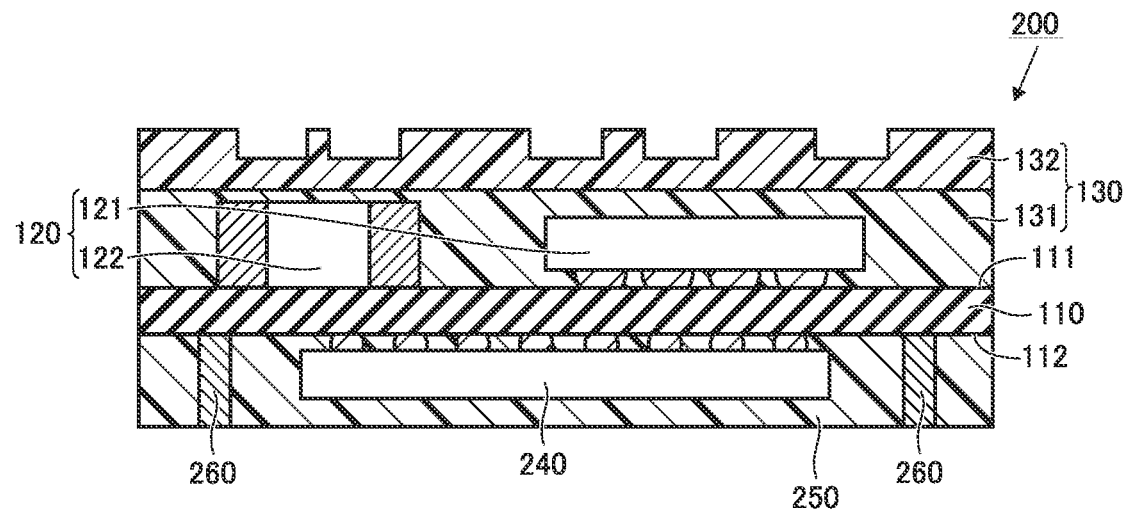
FIG. 9 is a sectional view illustrating a module according to a second embodiment of the present disclosure.

FIG. 9 is a sectional view illustrating the module of the second embodiment of the present disclosure. As illustrated in FIG. 9, a module 200 of the second embodiment of the present disclosure further includes a second component 240, a second sealing resin layer 250, and a connection electrode 260. Second component 240 is mounted on second principal surface 112. Second sealing resin layer 250 is provided on second principal surface 112 and seals second component 240. Connection electrode 260 is connected to substrate 110 and located so as to penetrate second sealing resin layer 250.

Also in the second embodiment, because the content rate of the filler in first sealing resin layer 130 is smaller in the second portion on the side opposite to substrate 110 than in the first portion on the side of substrate 110, similarly to the first embodiment of the present disclosure, the height of module 100 can be reduced by reducing the thickness of first sealing resin layer 130 while the damage to first component 120 mounted on first principal surface 111 of substrate 110 by the irradiation with the marking laser is prevented.

Third Embodiment

A module according to a third embodiment of the present disclosure will be described below. A module of the third embodiment of the present disclosure is different from module 100 of the first embodiment of the present disclosure in further including a shield layer. Accordingly, the description of the same configuration as that of module 100 of the first embodiment of the present disclosure will not be repeated.

Figure 10:
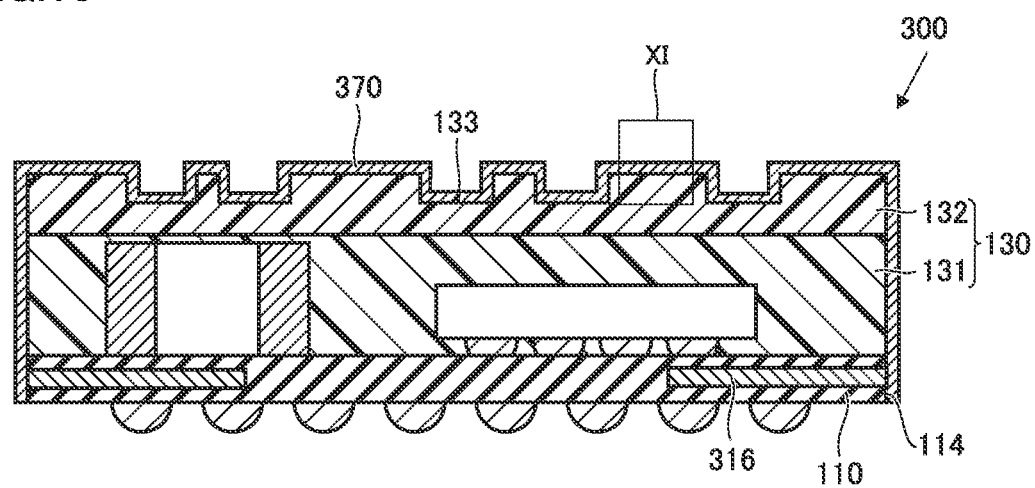
FIG. 10 is a sectional view illustrating a module according to a third embodiment of the present disclosure.
Figure 11:
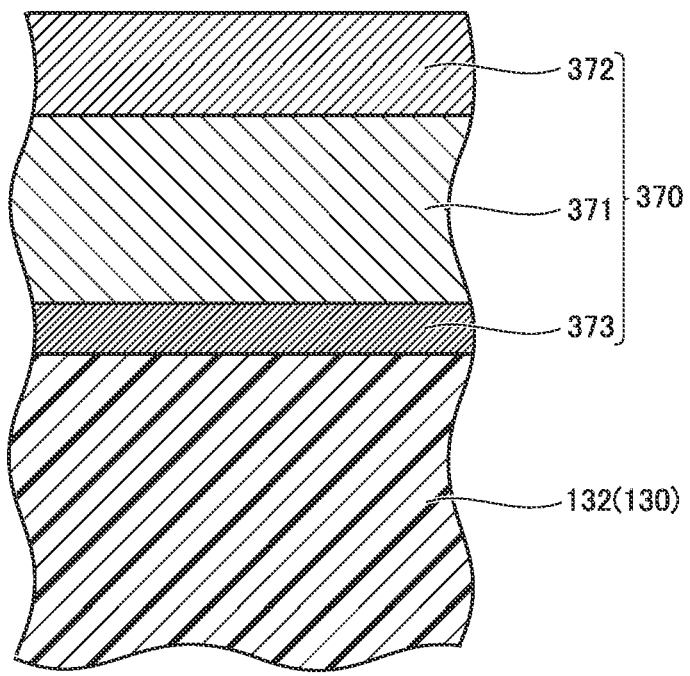
FIG. 11 is a partially enlarged view of an XI portion in FIG. 10.

FIG. 10 is a sectional view illustrating the module of the third embodiment of the present disclosure. FIG. 11 is a partially enlarged view of an XI portion in FIG. 10.

As illustrated in FIG. 10, a module 300 of the third embodiment of the present disclosure further includes a shield layer 370. Shield layer 370 is located so as to cover the surface of first sealing resin layer 130. Shield layer 370 is located along the outer shape of marking portion 133. In addition, because shield layer 370 contains metal as described later, the surface orthogonal to the optical axis reflects light as it is in shield layer 370 and becomes bright, and the surface not orthogonal to the optical axis reflects light in another direction and becomes dark, so that brightness and darkness are easily realized according to an uneven shape of marking portion 133. Thus, the visibility of the shape of marking portion 133 is improved by shield layer 370 located along the shape of marking portion 133.

As illustrated in FIG. 11, shield layer 370 includes at least a conductive layer 371. Thus, in the third embodiment, interference with first component 120 due to an electromagnetic wave from the outside can be prevented.

In the third embodiment, in order to bring shield layer 370 and first sealing resin layer 130 into close contact with each other, the second portion of first sealing resin layer 130 on the side opposite to substrate 110 contains the filler made of the inorganic oxide. Specifically, marking layer 132 contains the filler made of the inorganic oxide.

In the third embodiment, conductive layer 371 is preferably formed of a metal having high electrical conductivity. For example, conductive layer 371 is formed of Cu.

As illustrated in FIG. 11, in the third embodiment, shield layer 370 further includes a rust prevention layer 372 located in conductive layer 371 on the opposite side of first sealing resin layer 130. Accordingly, in the third embodiment, oxidation or corrosion of conductive layer 371 can be prevented.

In the third embodiment, for example, rust prevention layer 372 is formed of Ni, Cr, Ti, or an alloy of at least two metals selected from these. The alloy includes SUS. The average thickness of rust prevention layer 372 is thinner than that of conductive layer 371. For example, the average thickness dimension of rust prevention layer 372 is larger than 0.1 μm and smaller than 10 μm.

In the third embodiment, shield layer 370 further includes an adhesion layer 373 in contact with first sealing resin layer 130. Thus, in the third embodiment, the adhesion between shield layer 370 and first sealing resin layer 130 can be improved.

For example, adhesion layer 373 is formed of the same material as the material capable of forming rust prevention layer 372. The average thickness of adhesion layer 373 is thinner than that of conductive layer 371.

As illustrated in FIG. 10, in the third embodiment, shield layer 370 is located so as to cover peripheral side surface 114. Substrate 110 includes a ground electrode 316. Ground electrode 316 is exposed on peripheral side surface 114 and electrically connected to shield layer 370.

The method for manufacturing module 300 of the third embodiment of the present disclosure further includes a step of providing shield layer 370 on first sealing resin layer 130 and peripheral side surface 114 of substrate 110 in addition to the step included in the method for manufacturing module 100 of the first embodiment of the present disclosure. Specifically, shield layer 370 is formed by a physical film forming method such as sputtering in a vacuum device. In order to improve the adhesion of shield layer 370 to first sealing resin layer 130 before the formation of shield layer 370, the method for manufacturing module 300 of the third embodiment may further include a surface treatment step of first sealing resin layer 130. Specifically, the surface treatment of first sealing resin layer 130 is performed by irradiating first sealing resin layer 130 with an ion such as Ar or N.

Fourth Embodiment

A module according to a fourth embodiment of the present disclosure will be described below. The module of the fourth embodiment of the present disclosure is mainly different from module 300 of the third embodiment of the present disclosure in that the component is mounted on second principal surface 112. Accordingly, the description of the same configuration as that of module 300 of the third embodiment of the present disclosure will not be repeated.

Figure 12:
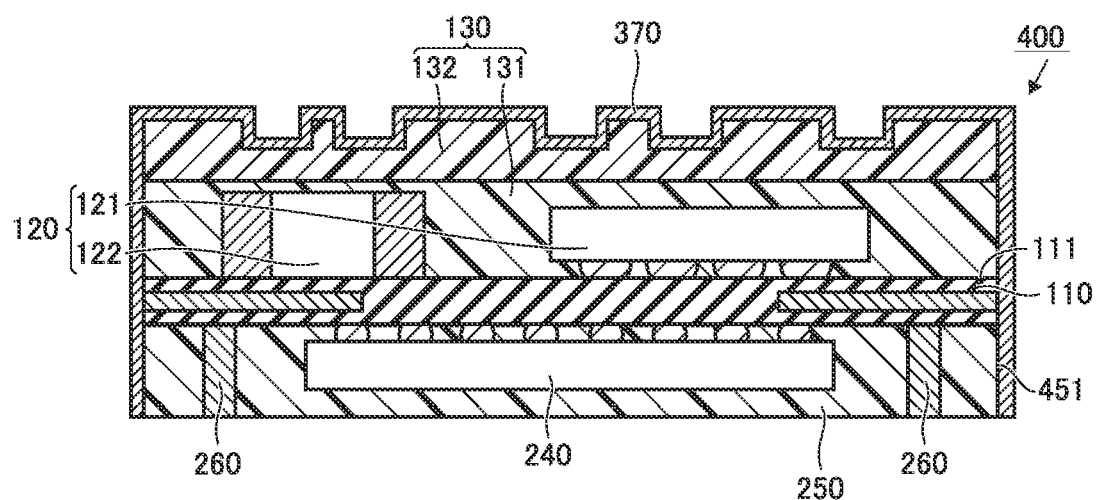
FIG. 12 is a sectional view illustrating a module according to a fourth embodiment of the present disclosure.

FIG. 12 is a sectional view illustrating the module of the fourth embodiment of the present disclosure. A module 400 of the fourth embodiment of the present disclosure further includes second component 240, second sealing resin layer 250, and connection electrode 260 similarly to the module of the second embodiment of the present disclosure. In the fourth embodiment, shield layer 370 is also located on a side surface 451 of second sealing resin layer 250 from on peripheral side surface 114 of substrate 110.

Also in the fourth embodiment, because the content rate of the filler in first sealing resin layer 130 is smaller in the second portion on the side opposite to substrate 110 than in the first portion on the side of substrate 110, similarly to the first embodiment of the present disclosure, the height of module 100 can be reduced by reducing the thickness of first sealing resin layer 130 while the damage to first component 120 mounted on first principal surface 111 of substrate 110 by the irradiation with the marking laser is prevented.

Fifth Embodiment

A module according to a fifth embodiment of the present disclosure will be described below. The module of the fifth embodiment of the present disclosure is mainly different from module 300 of the third embodiment of the present disclosure in that the first sealing resin is partially formed on the first principal surface of the substrate, a connector is provided in a portion of the first principal surface where the first sealing resin layer is not formed, and an antenna is provided on the second principal surface of the substrate. Accordingly, the description of the same configuration as that of module 300 of the third embodiment of the present disclosure will not be repeated.

Figure 13:
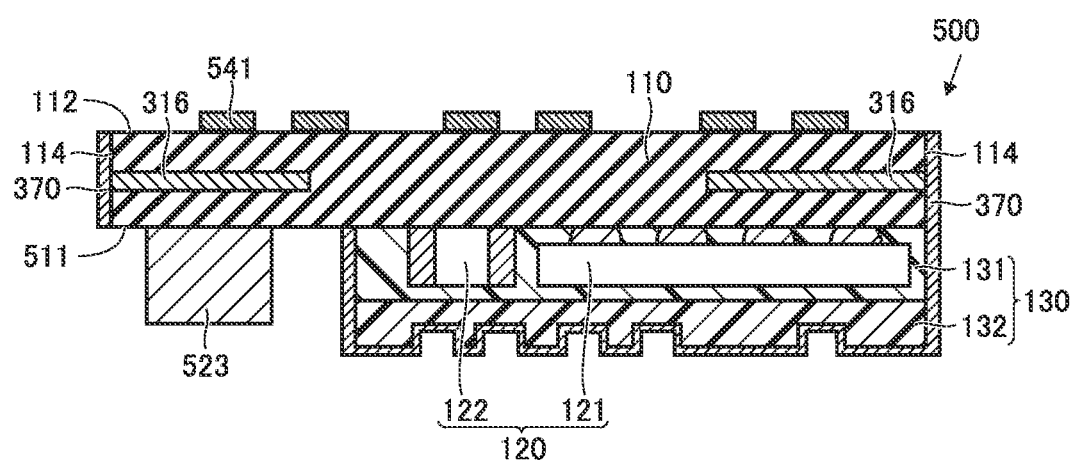
FIG. 13 is a sectional view illustrating a module according to a fifth embodiment of the present disclosure.

FIG. 13 is a sectional view illustrating the module of the fifth embodiment of the present disclosure. As illustrated in FIG. 13, in a module 500 of the fifth embodiment of the present disclosure, first sealing resin layer 130 is partially formed on a first principal surface 511 of the substrate. Shield layer 370 is located so as to cover the surface of first sealing resin layer 130 and peripheral side surface 114, but shield layer 370 does not cover at least a part of the region where first sealing resin layer 130 is not formed on first principal surface 511. Specifically, shield layer 370 does not cover the region where first sealing resin layer 130 is not formed on first principal surface 511. In first principal surface 511, connector 523 connected to substrate 110 is provided in the region where first sealing resin layer 130 is not formed. Furthermore, an antenna 541 connected to substrate 110 is provided on second principal surface 112 of substrate 110.

Also in the fifth embodiment, because the content rate of the filler in first sealing resin layer 130 is smaller in the second portion on the side opposite to substrate 110 than in the first portion on the side of substrate 110, similarly to the first embodiment of the present disclosure, the height of module 500 can be reduced by reducing the thickness of first sealing resin layer 130 while the damage to first component 120 mounted on first principal surface 511 of substrate 110 by the irradiation with the marking laser is prevented.

Sixth Embodiment

A module according to a sixth embodiment of the present disclosure will be described below. The module of the sixth embodiment of the present disclosure is mainly different from module 100 of the first embodiment of the present disclosure in the configuration of the first sealing resin layer. Accordingly, the description of the same configuration as that of module 100 of the first embodiment of the present disclosure will not be repeated.

Figure 14:
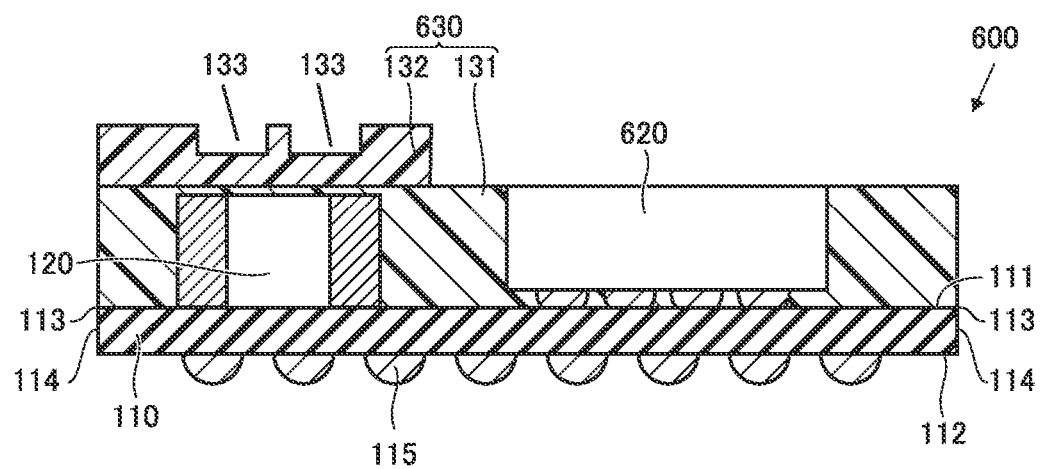
FIG. 14 is a sectional view illustrating a module according to a sixth embodiment of the present disclosure.

FIG. 14 is a sectional view illustrating the module of the sixth embodiment of the present disclosure. As illustrated in FIG. 14, in a module 600 of the sixth embodiment of the present disclosure, the second portion is provided in a part of a first sealing resin layer 630 as viewed from the laminating direction in which first sealing resin layer 630 is laminated on substrate 110. Thus, in the portion of first sealing resin layer 630 where the second portion is not provided, the height of module 600 can be further reduced.

Specifically, in first sealing resin layer 630, marking layer 132 is provided on a part of base layer 131 on the side opposite to substrate 110 when viewed from the base layer 131.

Module 600 of the sixth embodiment further includes a third component 620 mounted on first principal surface 111. Third component 620 is exposed from the first portion of first sealing resin layer 630 on the side opposite to substrate 110. Thus, the height of module 600 can be further reduced in the portion of module 600 where third component 620 is provided.

Specifically, third component 620 is exposed from base layer 131 on the side opposite to substrate 110. That is, third component 620 is located so as not to overlap the second portion (marking layer 132) when viewed from the laminating direction. Third component 620 may be sealed in first sealing resin layer 630. Third component 620 is a component similar to the component that can be used as first component 120. In the sixth embodiment, specifically third component 620 is an IC. Third component 620 may be a filter component such as a surface acoustic wave filter.

Seventh Embodiment

A module according to a seventh embodiment of the present disclosure will be described below. The module of the seventh embodiment of the present disclosure is mainly different from module 200 of the second embodiment of the present disclosure in the configuration of the first sealing resin layer. Accordingly, the description of the same configuration as that of module 200 of the second embodiment of the present disclosure will not be repeated.

Figure 15:
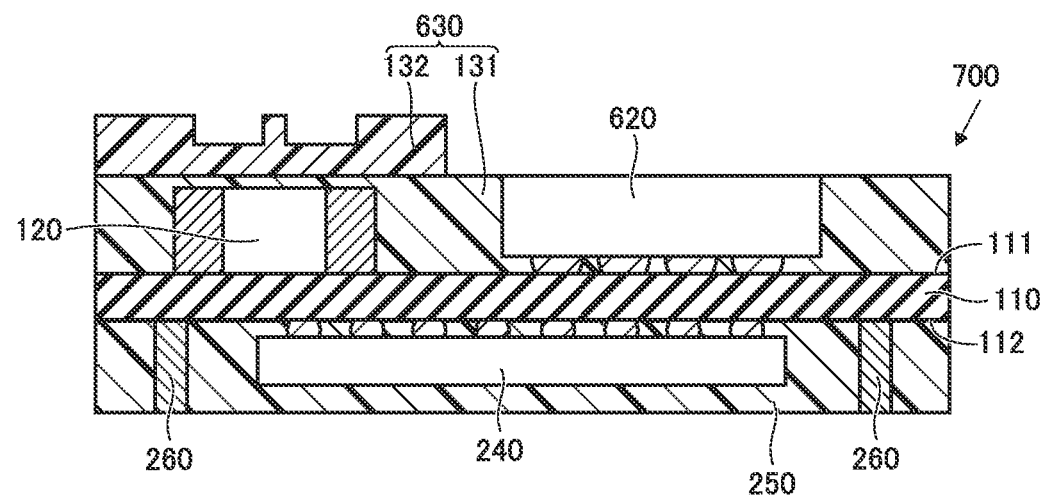
FIG. 15 is a sectional view illustrating a module according to a seventh embodiment of the present disclosure.

FIG. 15 is a sectional view illustrating the module of the seventh embodiment of the present disclosure. As illustrated in FIG. 15, first sealing resin layer 630 is provided in a module 700 of the seventh embodiment of the present disclosure similarly to module 600 of the sixth embodiment of the present disclosure. That is, the second portion (marking layer 132) is provided in a part of first sealing resin layer 630 when viewed from the laminating direction in which first sealing resin layer 630 is laminated on substrate 110. Thus, the height of module 700 can be further reduced in the portion of first sealing resin layer 630 where the second portion is not provided.

Module 700 of the seventh embodiment of the present disclosure further includes third component 620 similar to the module of the sixth embodiment of the present disclosure. Third component 620 is exposed from the first portion (base layer 131) of first sealing resin layer 630 on the side opposite to substrate 110. Thus, the height of module 700 can be further reduced in the portion of module 700 where third component 620 is provided.

Eighth Embodiment

A module according to an eighth embodiment of the present disclosure will be described below. The module of the eighth embodiment of the present disclosure is mainly different from module 300 of the third embodiment of the present disclosure in the configuration of the first sealing resin layer. Accordingly, the description of the same configuration as that of the module of the third embodiment of the present disclosure will not be repeated.

Figure 16:
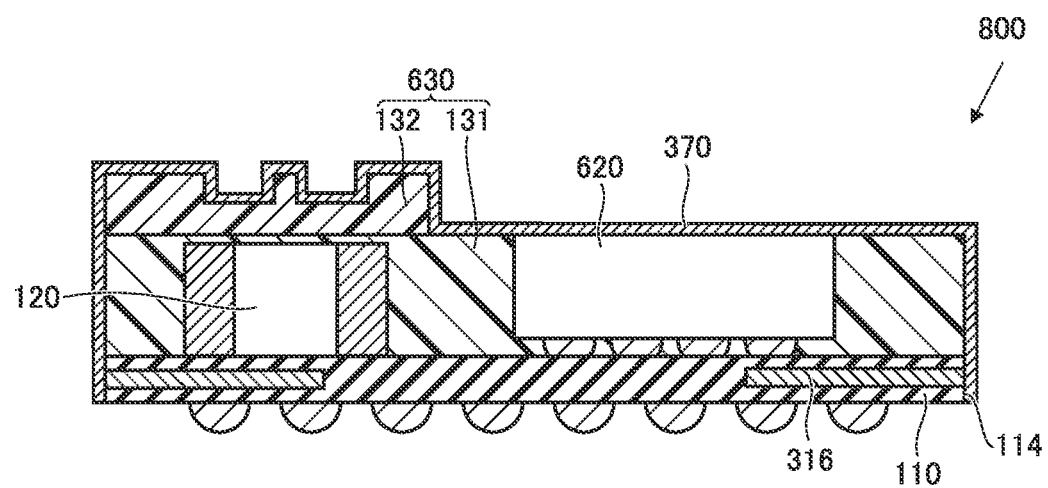
FIG. 16 is a sectional view illustrating a module according to an eighth embodiment of the present disclosure.

FIG. 16 is a sectional view illustrating the module of the eighth embodiment of the present disclosure. As illustrated in FIG. 16, first sealing resin layer 630 is provided in a module 800 of the eighth embodiment of the present disclosure similarly to module 600 of the sixth embodiment of the present disclosure. That is, the second portion (marking layer 132) is provided in a part of first sealing resin layer 630 when viewed from the laminating direction in which first sealing resin layer 630 is laminated on substrate 110. Thus, the height of module 800 can be further reduced in the portion of first sealing resin layer 630 where the second portion is not provided.

Module 800 of the eighth embodiment of the present disclosure further includes third component 620 similar to the module of the sixth embodiment of the present disclosure. Third component 620 is exposed from the first portion (base layer 131) of first sealing resin layer 630 on the side opposite to substrate 110. Thus, the height of module 800 can be further reduced in the portion of module 800 where third component 620 is provided.

Furthermore, in the eighth embodiment, shield layer 370 is in contact with the surface of third component 620 at the portion where third component 620 is exposed from first sealing resin layer 630. For example, shield layer 370 contains Cu, and thus has higher thermal conductivity than that of first sealing resin layer 630. Accordingly, in third component 620, heat dissipation to the outside of module 800 is further improved.

Ninth Embodiment

A module according to a ninth embodiment of the present disclosure will be described below. The module of the ninth embodiment of the present disclosure is mainly different from module 400 of the fourth embodiment of the present disclosure in the configuration of the first sealing resin layer. Accordingly, the description of the same configuration as that of the module of the fourth embodiment of the present disclosure will not be repeated.

Figure 17:
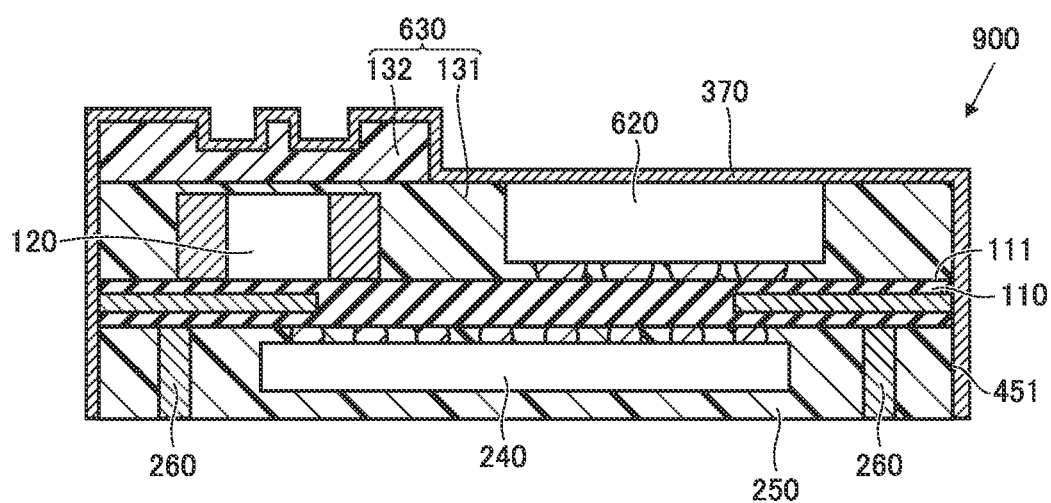
FIG. 17 is a sectional view illustrating a module according to a ninth embodiment of the present disclosure.

FIG. 17 is a sectional view illustrating the module of the ninth embodiment of the present disclosure. As illustrated in FIG. 17, first sealing resin layer 630 is provided in a module 900 of the ninth embodiment of the present disclosure similarly to module 600 of the sixth embodiment of the present disclosure. That is, the second portion (marking layer 132) is provided in a part of first sealing resin layer 630 when viewed from the laminating direction in which first sealing resin layer 630 is laminated on substrate 110. Thus, the height of module 900 can be further reduced in the portion of first sealing resin layer 630 where the second portion is not provided.

Module 900 of the ninth embodiment of the present disclosure further includes third component 620 similar to the module of the sixth embodiment of the present disclosure. Third component 620 is exposed from the first portion (base layer 131) of first sealing resin layer 630 on the side opposite to substrate 110. Thus, the height of module 900 can be further reduced in the portion of module 900 where third component 620 is provided.

Furthermore, in the ninth embodiment, shield layer 370 is in contact with the surface of third component 620 at the portion where third component 620 is exposed from first sealing resin layer 630. For example, shield layer 370 contains Cu, and thus has higher thermal conductivity than that of first sealing resin layer 630. Accordingly, in third component 620, heat dissipation to the outside of module 900 is further improved.

In the description of the above embodiments, configurations that can be combined may be combined with each other.

It should be considered that the disclosed embodiment is illustrative and non-restrictive in every respect. The scope of the present disclosure is defined by not the description above, but the claims, and it is intended that all modifications within the meaning and scope equivalent to the claims are included in the present disclosure.

100, 200, 300, 400, 500, 600, 700, 800, 900: module, 110: substrate, 110*a*: aggregate substrate, 111, 511: first principal surface, 112: second principal surface, 113: peripheral end, 114: peripheral side surface, 115: external terminal, 120, 121, 122: first component, 130, 630: first sealing resin layer, 131: base layer, 132: marking layer, 133: marking portion, 240: second component, 250: second sealing resin layer, 260: connection electrode, 316: ground electrode, 370: shield layer, 371: conductive layer, 372: rust prevention layer, 373: adhesion layer, 451: side surface, 523: connector, 541: antenna, and 620: third component.

The invention claimed is:

1. A module comprising:
a substrate including a first principal surface;
a first component mounted on the first principal surface; and
a first sealing resin layer containing a filler, provided on the first principal surface, and sealing the first component, wherein the filler contains an inorganic oxide as a main component,
wherein
the first sealing resin layer includes a first portion disposed on the substrate, and a second portion disposed on a side of the first portion opposite to the substrate,
a marking portion is provided on a surface of the second portion,
in the first sealing resin layer, a content rate of the filler is lower in the second portion than in the first portion, and
the first sealing resin layer is laminated on the substrate and includes a plurality of resin layers having different content rates of the filler from each other.

2. The module according to claim 1, wherein
the filler is granular, and
in the first sealing resin layer, a maximum diameter of the filler is smaller in the second portion than in the first portion.

3. The module according to claim 2,
wherein the substrate further includes a second principal surface located on a side opposite to the first principal surface, and
wherein the module further comprises:
a second component mounted on the second principal surface;
a second sealing resin layer provided on the second principal surface to seal the second component; and
a connection electrode connected to the substrate and located so as to penetrate the second sealing resin layer.

4. The module according to claim 2, further comprising a shield layer located so as to cover a surface of the first sealing resin layer,
wherein the shield layer includes at least a conductive layer.

5. The module according to claim 2, further comprising a shield layer located so as to cover a surface of the first sealing resin layer, wherein
the substrate further includes a second principal surface located on a side opposite to the first principal surface,
the first sealing resin layer is partially provided on the first principal surface of the substrate,
a connector connected to the substrate is provided in a region of the first principal surface where the first sealing resin layer is not provided, and
an antenna connected to the substrate is provided on the second principal surface of the substrate.

6. The module according to claim 1, wherein at least one layer of the plurality of resin layers located on a side of the first component opposite to a substrate side of the first component has a light shading property.

7. The module according to claim 6,
wherein the substrate further includes a second principal surface located on a side opposite to the first principal surface, and
wherein the module further comprises:
a second component mounted on the second principal surface;
a second sealing resin layer provided on the second principal surface to seal the second component; and
a connection electrode connected to the substrate and located so as to penetrate the second sealing resin layer.

8. The module according to claim 6, further comprising a shield layer located so as to cover a surface of the first sealing resin layer,
wherein the shield layer includes at least a conductive layer.

9. The module according to claim 1,
wherein the substrate further includes a second principal surface located on a side opposite to the first principal surface, and
wherein the module further comprises:
a second component mounted on the second principal surface;
a second sealing resin layer provided on the second principal surface to seal the second component; and
a connection electrode connected to the substrate and located so as to penetrate the second sealing resin layer.

10. The module according to claim 9, further comprising a shield layer located so as to cover a surface of the first sealing resin layer,
wherein the shield layer is also located on a side surface of the second sealing resin layer from on a peripheral side surface of the substrate.

11. The module according to claim 9, further comprising a shield layer located so as to cover a surface of the first sealing resin layer,
wherein the shield layer includes at least a conductive layer.

12. The module according to claim 1, further comprising a shield layer located so as to cover a surface of the first sealing resin layer,
wherein the shield layer includes at least a conductive layer.

13. The module according to claim 1, further comprising a shield layer located so as to cover a surface of the first sealing resin layer, wherein
the substrate further includes a second principal surface located on a side opposite to the first principal surface,
the first sealing resin layer is partially provided on the first principal surface of the substrate,
a connector connected to the substrate is provided in a region of the first principal surface where the first sealing resin layer is not provided, and
an antenna connected to the substrate is provided on the second principal surface of the substrate.

14. The module according to claim 1, wherein the second portion is provided in a part of the first sealing resin layer when viewed from a laminating direction in which the first sealing resin layer is laminated on the substrate.

15. The module according to claim 14, further comprising a third component mounted on the first principal surface,
wherein the third component is exposed from the first portion of the first sealing resin layer on the side of the first portion opposite to the substrate.

16. The module according to claim 1, wherein the substrate further includes a second principal surface located on a side opposite to the first principal surface, and wherein the module further comprises an external terminal provided on the second principal surface.

17. The module according to claim 1,
wherein the substrate further includes a second principal surface located on a side opposite to the first principal surface, and
wherein the module further comprises:
a second component mounted on the second principal surface;
a second sealing resin layer provided on the second principal surface to seal the second component; and
a connection electrode connected to the substrate and located so as to penetrate the second sealing resin layer.

18. The module according to claim 1, further comprising a shield layer located so as to cover a surface of the first sealing resin layer,
wherein the shield layer includes at least a conductive layer.

* * * * *